United States Patent [19]

Elliott

[11] Patent Number: 5,323,403
[45] Date of Patent: Jun. 21, 1994

[54] METHOD AND APPARATUS FOR MAXIMIZING PROCESS THROUGHPUT

[75] Inventor: John C. Elliott, Tucson, Ariz.

[73] Assignee: International Business Machines Corporation, Armonk, N.Y.

[21] Appl. No.: 960,171

[22] Filed: Oct. 13, 1992

Related U.S. Application Data

[63] Continuation of Ser. No. 575,730, Aug. 31, 1990, abandoned.

[51] Int. Cl.[5] .............................................. G06F 11/10
[52] U.S. Cl. .................................... 371/37.6; 364/741
[58] Field of Search ............................ 371/37.6, 37.7; 395/200, 325; 364/737, 741

[56] References Cited

U.S. PATENT DOCUMENTS

| | | | |
|---|---|---|---|
| 3,622,985 | 11/1971 | Ayling | 371/37.6 |
| 4,312,068 | 1/1982 | Goss | 371/37.6 |
| 4,593,393 | 6/1986 | Mead | 371/37 |
| 4,700,350 | 10/1987 | Douglas et al. | 371/37.1 |
| 4,728,930 | 3/1988 | Grote et al. | 340/347 |
| 4,766,566 | 8/1988 | Chuang | 395/375 |
| 4,879,718 | 11/1989 | Sanner | 371/22.3 |
| 4,977,537 | 12/1990 | Dias | 365/222 |

*Primary Examiner*—Debra A. Chun
*Attorney, Agent, or Firm*—D. A. Shifrin; F. E. Anderson; M. W. Schecter

[57] ABSTRACT

Two identical CRC circuits are cross coupled to make alternate CRC calculations based on the other CRC circuit's calculation. Throughput of the CRC code calculation is improved by applying alternate input data simultaneously at each of the CRC circuits so that when one calculation is completed the next input data is available to immediately begin the next calculation. The output of each CRC circuit is fed into one of two latches that make up an LSSD register such that the first latch captures the first CRC calculation on a first clock of non-overlapping clocks. The second CRC calculation is captured by the second latch on a second clock of the non-overlapping clocks. Two CRC calculations can be made in one period of the non-overlapping clocks while avoiding race problems.

17 Claims, 2 Drawing Sheets

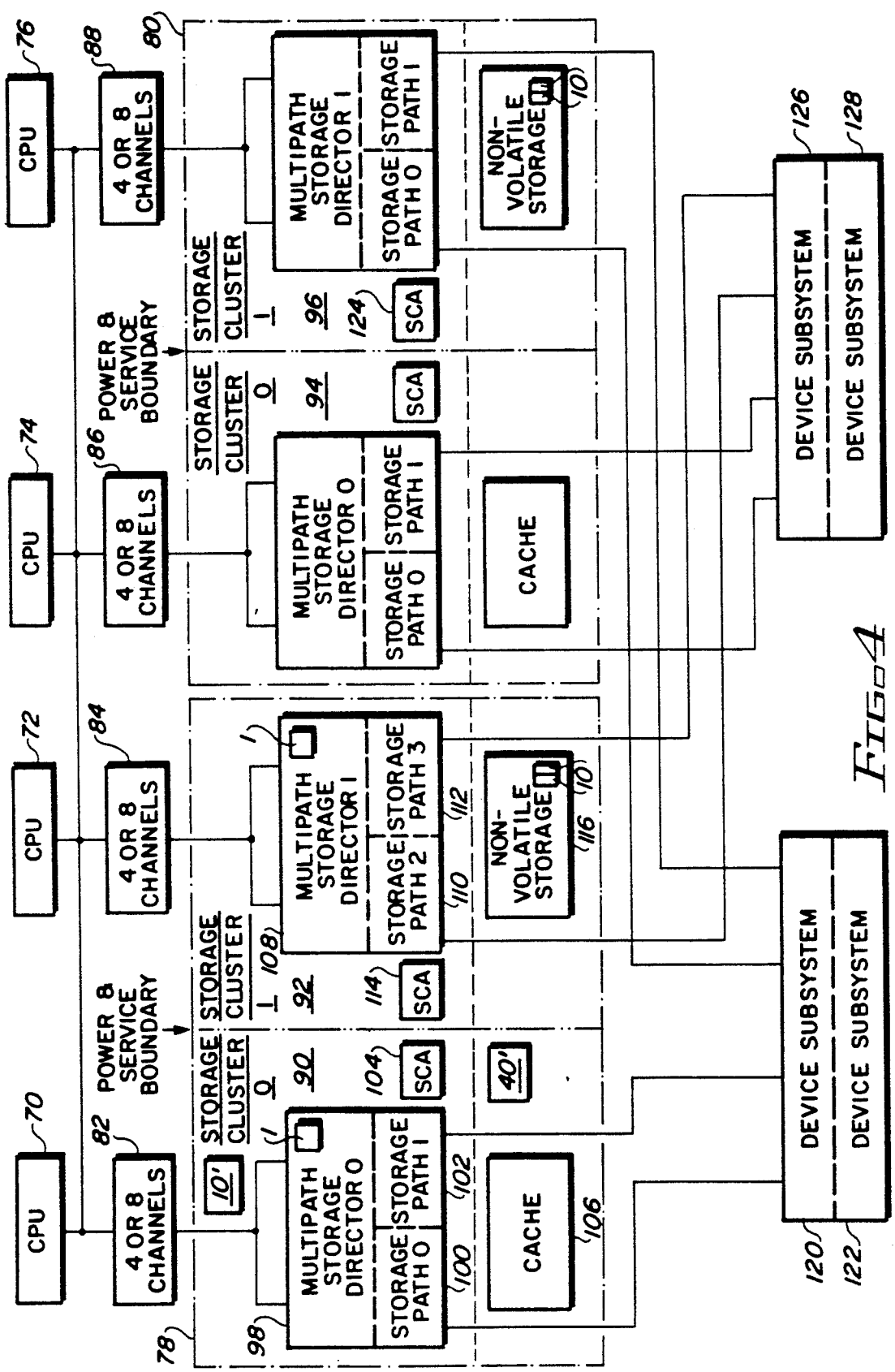

METHOD AND APPARATUS FOR MAXIMIZING PROCESS THROUGHPUT

This is a continuation of application Ser. No. 575,730 filed Aug. 31, 1990, now abandoned.

FIELD OF THE INVENTION

This invention relates generally to the field of electronic circuits and more particularly, to an apparatus and method for increasing process throughput by cross coupling dependent identical processes.

BACKGROUND OF THE INVENTION

System performance is continually being improved in order to maximize the amount of information that can be processed in a given period of time. In computer systems, for example, it is desirable to make mathematical calculations as fast as possible since many problems require millions of such calculations. Likewise, in communication systems, if more data can be transferred between locations in a set time period, the communication can be performed more economically.

Several approaches have been taken to further improve system performance. These approaches include improving the semiconductor technology from which the systems are made, and increasing the hardware used to perform the system functions. Very Large Scale Integrated (VLSI) circuits may be made to operate faster by shrinking transistors to ever smaller feature sizes. Still more performance enhancements may be realized by processing information in parallel which typically requires duplicating the hardware in a system. Two data processors may be used, for example, where each processor performs a different instruction but at the same time (parallel processing).

A system which uses two processors to process instructions in parallel is described in Grote et al. U.S. Pat. No. 4,728,930. In this system, data is latched for processing by a master processor, and other data is latched for processing by an independent slave processor. The slave processor processes its received data while the master processor is busy processing its received data. The slave processor does not completely depend upon the master processor to perform it functions. As a result, it is not necessary for the master processor to complete its processing before new data may be processed and performance can therefor be enhanced.

Parallel processing of two instructions in a single processor may be accomplished by using dual execution units (typically the portion of the processor containing the Arithmetic Logic Unit (ALU) for performing logic and mathematical operations). Chuang U.S. Pat. No. 4,766,566 describes a processor having dual execution units on a single chip for executing ALU instructions in parallel wherein one execution unit includes an ALU and the other execution unit includes an ALU with additional related logic to allow processing of more complex calculations. The single processor as described may perform calculations in parallel thus increasing processing throughput.

In some processes it is necessary for one calculation to be processed before further processing can take place. Processing is thus required to be accomplished in a serial manner so that performance improvement may not be realized by simply duplicating hardware and performing parallel processing. A method well known to those skilled in the art for improving the throughput of serially executed instructions is pipelining. Basically, in a pipelined system, the result of one calculation or instruction execution is stored in a register for the next stage whose output is stored in a register for the next stage and so on. The registers are made up of latches which are under the control of a system clock so that on each clock cycle each stage is executing an instruction or performing a calculation to be provided to the next stage. Performance is improved since each stage can be executing a portion of the process instead of waiting for a result to propagate through the entire structure before another instruction can be started.

A special type of pipelining system exists wherein a process requires the result of a calculation stored in a register to be fed back into the circuit which made the calculation before executing the next calculation. The throughput of the process is limited by the propagation of the process through the circuit and the register. This type of calculation is hereinafter referred to as a dependent identical process. A traditional pipelining architecture does not improve performance since the stage to receive the results of the previous clock cycle is the same stage that provided those results.

An example of a dependent identical process generator is a Cyclic Redundancy Checker (CRC) circuit. A typical application of CRC circuits is to provide a check for ensuring that data sent from one location is the same data that is received at another location. To accomplish the data integrity check, a CRC circuit generates a CRC code representing the sent data. When that data is received, an identical CRC circuit generates a second CRC code. If the data received matches the data sent, the two CRC codes will match. Each CRC code is calculated from a series of CRC sums which are further calculated from each new data word and the previous CRC sum. Calculating the CRC code requires that each CRC sum be temporarily stored in a register which is then fed back into the inputs of the CRC circuit before the next calculation or sum can be computed. Thus, each CRC sum is a function of a previous CRC sum and the sent or received data.

A quasi parallel CRC circuit is described by Mead in U.S. Pat. No. 4,593,393. This invention describes a system where a number of bits for a CRC sum are processed in parallel. The next set of bits cannot be processed until the CRC sum of the previous bit is calculated and fed back into the inputs of the CRC circuit. In this scenario, processes such as CRC sums are not conducive to parallel processing since the present calculation is dependent upon the previous calculation. Furthermore, these calculations will not benefit from traditional pipelining methods since the previous CRC sum is fed back into the same processing block.

The problems of increasing performance of dependant identical processes may be further exacerbated by the need to ensure the integrity of the data that is stored in the registers. It is well known in the art to use Level Sensitive Scan Design (LSSD) techniques for improving the integrity of the stored data. A LSSD register includes two latches which are driven by non-overlapping clocks. In this scenario, the result of a CRC calculation would be loaded into latch one on a first clock and stored in the second latch on a second clock. As a result, only one CRC sum can be calculated during the period of the non-overlapping clocks.

Thus what is needed is an apparatus and method which provides for higher throughput of calculations of dependent identical processes wherein more than one calculation can be executed during the period of non-overlapping clocks in an LSSD design environment.

SUMMARY OF THE INVENTION

Accordingly, it is an object of the present invention to provide a method of performing multiple calculations of dependent identical processes in a single non-overlapping clock period.

Another object of the present invention is to provide an improved CRC circuit that allows two CRC calculations of a CRC sum to be calculated in a single non-overlapping clock period.

Yet another object of the present invention is to provide an improved CRC circuit utilizing LSSD type registers.

These and other objects of this invention are accomplished by applying a first word to a first process generator while applying the next word to a second process generator such that the first word is available for at least a portion of time that the next word is available. A reset value or a result of a first calculation of the process is applied to the first process generator. The first process generator provides a second calculation from the first word and the reset value or first calculation. A latch coupled to the first process generator latches the second calculation on a first portion of a non-overlapping clock. The second calculation is applied to the second process generator which then makes a third calculation from the second word and the second calculation. The third calculation is stored in a second latch coupled on a second portion of the non-overlapping clock. The process continues until all words have been applied and processed.

The foregoing and other objects, features and advantages of the invention will be apparent from the following more particular description of the preferred embodiment of the invention, as illustrated in the accompanying drawing.

BRIEF DESCRIPTION OF THE DRAWING

FIG. 4 is a block diagram of a data processing system and the communications between the parts of the system to practice the method for maximizing process throughput.

DESCRIPTION OF THE PREFERRED EMBODIMENT

Figure 1:
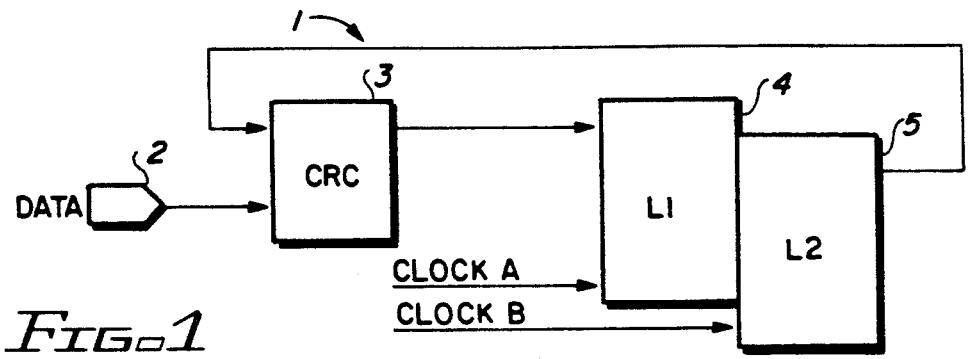
FIG. 1 is a block diagram of a prior art parallel CRC generator utilizing a LSSD register.

FIG. 1 is an example of a circuit for generating dependent identical processes. The circuit is a parallel CRC generator/checker 1. Each CRC sum is dependent upon the CRC sum that was calculated prior in combination with currently applied data. Each CRC sum is calculated in an identical manner wherein only input data applied to the CRC generator/checker 1 changes. When all the data has been applied, the last CRC sum is a desired CRC code. Data is input at a terminal 2 to be applied to a data input of a CRC block 3.

The number of bits making up the data may vary depending on the application. $L_1$ 4 and $L_2$ 5 are latch elements making up a LSSD register (there exists one latch 4 and 5 for each bit of the input data, the plurality of latches 4 and 5 forming a register). Clock A and clock B are non-overlapping clocks such that when clock A is "high," the CRC sum output from the CRC block 3 is loaded into the latch 4 and when the clock B later goes "high," the CRC sum is transferred from the latch 4 and into the latch 5. The clocks A and B must be non-overlapping in order to prevent a race condition. The race condition would occur if the result of a CRC sum were able to propagate through the latches 4 and 5 and back into CRC block 3 before a new data was applied. To ensure proper results, the present CRC sum must be settled and latched in $L_1$ 4 and new data available before the present CRC sum is fed back to the CRC block 3.

When the CRC sum is loaded into the latch 5 on clock B, it becomes available at a feedback input of the CRC block 3 to be combined with the next set of data at the terminal 2. The non-overlapping clocks A and B are necessary, then, to keep the CRC sum from feeding back into the CRC block 3 until the last calculation is completed. The minimum cycle time in the parallel CRC generator/checker is limited to the sum of a setup time of the latch 4, a delay from the clock A "high" to the clock B "high," a propagation delay through latch 5, and the delay through the CRC block 3. There is a resulting time period in which no CRC calculation can be made which includes the time from when the CRC sum is valid in the latch 4 until that CRC sum propagates through the latch 5 after the clock B has gone "high." The throughput of the CRC sum is limited by the propagation through the CRC generator/checker 1 while a portion of that time is dedicated to ensuring a race condition does not occur.

Figure 2:
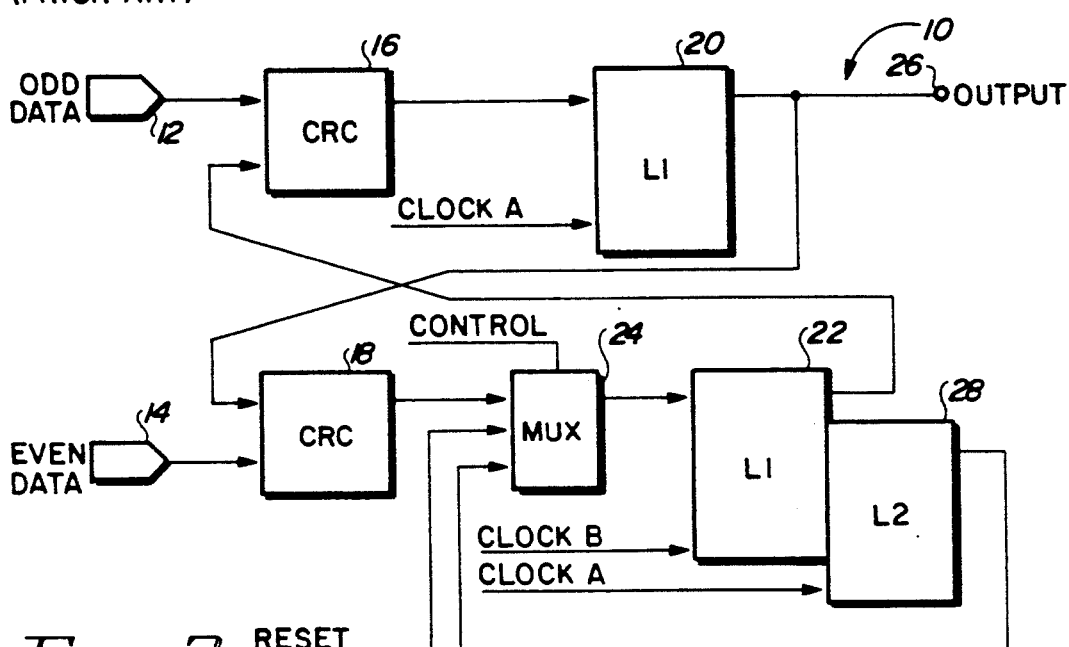
FIG. 2 is a block diagram of the preferred embodiment of the present invention.

Referring to FIG. 2, a preferred embodiment of the present invention is shown wherein the resulting time period in which no CRC calculation could be made is utilized to make a second CRC calculation. A CRC generator/checker 10 is shown having two CRC blocks 16 and 18. Odd data is applied to a terminal 12 which is connected to a data input of the CRC block 16, and even data is applied to a terminal 14 which is connected to a data input of the CRC block 18. A first data of the odd data is made available to the CRC block 16 for the calculation of a first CRC sum. Before the first CRC sum is calculated, however, a second data of the even data is applied to the CRC block 18 in anticipation of the first CRC sum being completed and before the first data is removed. Likewise, a third data of the odd data is applied after the first CRC sum is completed, but before the second CRC sum is completed by the CRC block 18 and the second data removed. As a result, both an odd data and an even data will be available simultaneously during the CRC sum calculations. This can be seen in the timing diagrams depicted in FIG. 3 where signal 30 represents the odd data and signal 32 represents the even data.

Figure 3:
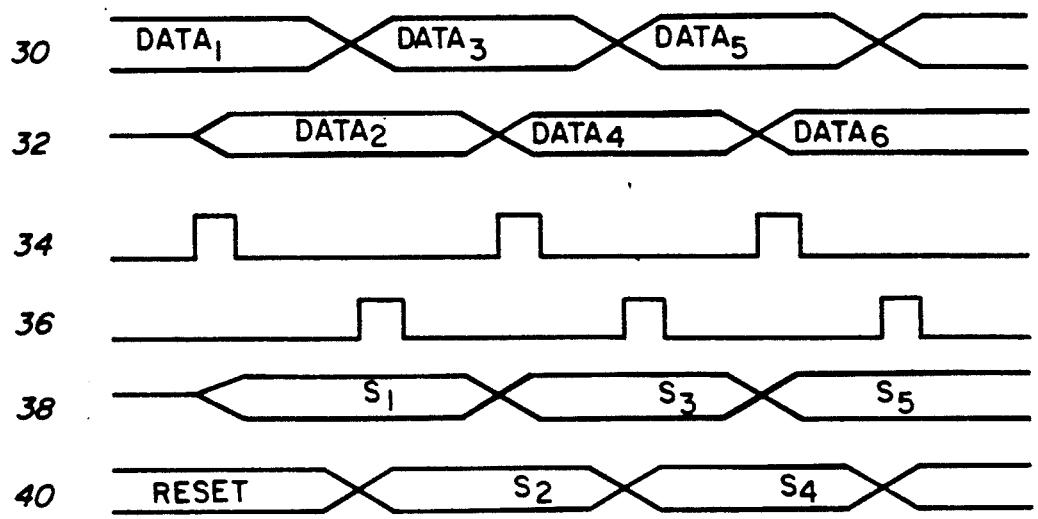
FIG. 3 is a timing diagram of the operation of the preferred embodiment.

A latch, $L_1$ 20, having the clock A connected thereto and a latch, $L_1$ 22, having the clock B connected thereto, combine to alternately receive the CRC sums calculated by the CRC blocks 16 and 18 on clocks A and B respectively. $L_1$ 20 is the front latch of a LSSD register where the second half of the LSSD register is not shown as it is used for scan test purposes. A latch, $L_2$ 28, is the second half of a LSSD register having the clock A connected thereto for receiving the output of the $L_1$ 22 and providing a feedback signal on the clock A. The latch 20 has a data input connected to an output of the CRC block 16 so that when the clock A goes "high," shown as signal 34 in FIG. 3, the first CRC sum is loaded into the latch 20. An output of the latch 20 is connected to an output terminal 26, and further connected to a feedback input of the CRC block 18. The first CRC sum, shown as $S_1$ of signal 38 in FIG. 3 is available from the output of the latch 20.

A multiplexer 24 (mux) has a first multiplexed input connected to an output of the CRC block 18, a second multiplexed input connected for receiving a reset signal, and a third multiplexed input for receiving an output from the $L_2$ 28. A control signal is connected to the mux 24 for selecting which of the multiplexed inputs will be provided at an output of the mux 24. The latch 22 has a data input connected to the output of the mux 24 for loading either the reset signal or the second CRC sum, $S_2$ 40, when the clock B 36 goes "high." An output of the latch 22 is connected to a feedback input of the CRC block 16. Clocks A and B are free running clocks such that when no new data is being applied at the input terminals 12 and 14 the control signal will select the output from $L_2$ 28 in order to hold the present data. It can be appreciated that in order to select the output from either latch 20 or 22 at the output terminal 26 that a multiplexer could be inserted therebetween.

Referring now to FIG. 4, there is shown a multi CPU and shared device configuration. A plurality of CPU systems identified with the reference numerals 70, 72, 74 and 76 are suitably cross connected to a pair of controller systems 78 and 80, via a plurality of channels 82, 84, 86 and 88. Each controller system, 78 and 80, includes two storage clusters.

Controller system 78 includes storage clusters 90 and 92, while controller system 80 includes two storage clusters 94 and 96. Storage cluster 90, for instance, includes a multi path storage director 98, which in turn includes two storage paths 100 and 102. Each storage cluster 90 also includes a shared control array (SCA) 104 and can include a cache memory system 106. The storage cluster 92 includes a multi path storage director 108 and two storage path controls 110 and 112, as well as its own shared control array (SCA) 114. Storage cluster 92 includes a nonvolatile storage 116. The control system 78 has its storage paths 100 and 102 connected to a plurality of devices divided into two device subsystems 120 and 122. Using a device level selection enhanced mode of data transfer, simultaneous data transfer is possible over all four storage paths, within the same four path string. Each device subsystem 120 and 122 has communication with each storage path 100 and 102 of the storage cluster 90 as well as communication with the storage paths of storage cluster 80.

Two device subsystems 126 and 128 are connected to the storage paths 110 and 112 of the storage cluster 92 and the storage paths of storage cluster 94. Both sets of device subsystems 120, 122, and 126, 128 operate in tandem, as controlled by the controller systems 78 and 80.

Each of the storage clusters in each of the controller systems operate as independent components. Each storage cluster provides a separate power and service region and two separate paths to the devices. The loss of power to one storage cluster does not prevent access to data because the processing can continue through other storage clusters. All of the devices connected to the controller systems are cross configured to both controller systems and to one storage cluster within each of the controller systems. The devices in the device subsystems 120 and 122 are generally direct access storage devices (DASD) disk devices, although the devices could be tape or optical devices. Each storage cluster has its own support facility. Each storage cluster contains a volatile product data storage module that stores the features of the controllers, the subsystem mode of operations, the subsystem identifiers, the subsystem configuration, the controller unit addresses for each channel, the type of channel and the channel speed connected to each storage cluster and the number of addressable devices that can be attached to the logical systems in the devices block.

The device level selection enhanced mode of operation permits two multi path storage directors to access data in the device subsystems. Each multi path storage director has two storage paths, as shown in FIG. 4. The device level selection enhanced mode provides four independent and simultaneous data transfer paths to the same two device subsystems from the two controller systems. The input/output operation can be dynamically reconnected on any one of the four paths. Thus there are four complete independent paths from the CPU to the devices.

Each storage cluster 90, for instance, contains channel attachments to connect the channel 82 to the multi path storage director 98. The storage director 98 is connected to the two storage paths 100 and 102. The storage cluster 90 includes the shared control array 104. The cache 106 and the nonvolatile storage 116 are shared by the storage path in both the storage cluster 90 and the storage cluster 92, but are physically and logically separate from the storage clusters. Each storage cluster is an independent component. Each provides a separate power and service region and two separate paths to the device subsystem. Cache and nonvolatile storage are accessed by both storage cluster in one controller system. The storage directors interpret channel commands and control the storage paths, the cache, the nonvolatile storage, and the attached devices in the device subsystem. Each storage path is separately connected to all devices in the device subsystems. During a channel connected operation, the storage path is coupled with a particular channel. The multi-path storage director provides, through a single channel address, multi-path access to the devices. Through one storage director address, the multi path storage director selects either storage path in the storage cluster for data transfer operation. The shared control array contains the status information about the storage paths and the devices.

Each set of device subsystems, device subsystems 120 and 122 for instance, is connected to both controller systems 78 and 80. Each has a line to each storage path, storage path 100 and 102 for instance, of each storage director, storage director 98 for instance. Thus, device systems 120 and 122, for instance, has four paths to the CPU's, two to storage cluster 90 of controller system 78 and two to storage cluster 96 of controller system 80. Thus, on a poll sequence, an interrupt request from a device in either device subsystem 120 or 122 will be sensed by all four storage paths. Any one of the storage paths can satisfy the interrupt.

The cache 106 is a high density, electronic storage that is shared by all storage paths connected to the controller system 78. Frequently used data can be transferred to and from the cache 106 and the channel 82 at channel speeds. Access time between the cache 106 and one channel of the channels 82 is much faster than between the devices of the device subsystems and the channel because there are no delays. The cache 106 is in a separate power region from the storage clusters 90 and 92, to permit the cache processing through either storage cluster, when the other storage cluster is off line for any reason.

The nonvolatile storage 116 provides random access electronic storage. A battery backup system maintains power to the nonvolatile storage 116. The nonvolatile storage holds the data that needs to be transferred to the devices of the device subsystems 120 and 122. If power is lost to the controller system 78 before the information can be transmitted to the devices, the data is held in the nonvolatile storage 116 until the power is restored, at which time the data is destaged to the devices.

Several CRC generator/checker's 10 are contained within the nonvolatile storage 116. The CRC generator/checker 10 provides a data interface to the nonvolatile storage 116 such that data integrity of data being stored therein can be provided. Ensuring data integrity on a store operation by the CRC generator/checker 10 is crucial since immediate detectability is required in the case of a power loss.

The shared control arrays 104 and 114 are electronic storage that contains the information about the status of the controller system 78 and the attached devices in the device subsystems. Identical information is kept in the shared control array of each storage cluster. In the pairing such as shown in FIG. 4, the shared control array information is duplicated into the two storage clusters that are paired together. For instance, the shared control array 104 of storage cluster 90 is paired to a shared control array 124 in the storage cluster 96.

METHOD OF OPERATION

The CRC checker/generator 10 may be used to effectively increase the throughput of CRC sum calculations. While the invention is described using CRC calculations, it can be appreciated that the invention applies equally to other dependent identical processes. Referring again to FIG.'s 2 and 3, when making the CRC sum calculations the CRC generator/checker 10 is first initialized. Initialization is accomplished be applying the odd data 30 and the even data 32 to the input terminals 12 and 14 respectively. The reset signal (initialization value) is latched into the latch 22 under the control of the control signal and applied to the feedback input of the CRC block 16. The CRC block 16 then calculates the first CRC sum, $S_1$ 38, from the reset signal and the odd data 30 ($Data_1$). Thereafter, the control signal changes state to allow the output of the CRC block 18 to pass through the mux 24 while the reset signal is ignored.

When clock A 34 goes "high," $S_1$ 38 is loaded into the latch 20 and is available at the feedback input of the CRC block 18. Since even data 32 ($Data_2$) is already available, the CRC calculation of $S_2$ 40 begins immediately. The race condition problem is avoided since $S_1$ 38 is fed into a CRC block other than the one making the calculation. The result thus far, then, is that $Data_1$ 30 and reset have produced $S_1$ 38 which is loaded and latched into the latch 20 on clock A. $S_1$ 38 and $Data_2$ 32 are used to calculate $S_2$ 40, being loaded and latched into the latch 22 on clock B 36. Two CRC sums have been calculated in the period of a single non-overlapping clock while avoiding race condition problems.

Before $S_2$ 40 has been calculated, $Data_3$ of the odd data 30 is available at the data input of the CRC block 16. Therefore, when $S_2$ 40 is loaded into the latch 22, the CRC block 16 is ready to receive $S_2$ 40 to make the next calculation. As a result, a CRC sum is calculated on each phase of the non-overlapping clocks 34 and 36 to increase the throughput of the CRC calculations beyond the limits of the propagation delay of a single CRC block and latch. This process continues with the calculation of additional CRC sums until a CRC code is computed. While the output terminal is shown connected to the latch 20, it may equally be connected to the latch 22.

While the invention has been particularly described with reference to particular embodiments thereof, it will be understood by those skilled in the art that various other changes in detail may be made therein without departing from the spirit, scope, and teaching of the invention. For example, the number of bits used in the CRC calculations may vary. Furthermore, this invention is applicable to the generation of other processes requiring a feedback signal in order to make the next calculation using an identical process.

What is claimed is:

1. A method for generating identical dependent processes, comprising the steps:

receiving first data at a first input of a first process generator during a first time period;

receiving second data at a second input of the first process generator during the first time period;

latching a first result, generated by the first process generator from the first data and the second data, in a first register at the end of the first period upon receipt of a first signal from a first clock;

receiving third data at a first input of a second process generator during a second time period commencing upon receipt of the first signal from the first clock;

receiving the first result from the first register at a second input of the second process generator during the second time period;

latching a second result, generated by the second process generator from the third data and the first result, in a second register upon receipt of a first signal from a second clock at the end of the second period, the first signal of the second clock being non-overlapping with respect to the first signal of the first clock;

receiving fourth data at the first input of the first process generator during a third time period commencing upon receipt of the first signal from the second clock;

receiving the second result from the second register at the second input of the first process generator during the third time period; and latching a third result, generated by the first process generator from the fourth data and the second result, in the first register upon receipt of a second signal from the first clock at the end of the third period, the second signal of the first clock being non-overlapping with respect to the first signal of the second clock.

2. The method according to claim 21 wherein said first, second and third results are first, second and third CRC sums, respectively.

3. The method according to claim 1 wherein the first result is latched in a first LSSD register.

4. The method according to claim 3 wherein the second result is latched in a second LSSD register.

5. The method according to claim 1 wherein the first data is replaced by the fourth data at the first input of the first process generator while the second data is still available at the first input of the second process generator.

6. A process generating circuit, comprising:
   a first process generating means coupled for sequentially receiving first data and latched first calculations and for providing second calculations therefrom;
   a second process generating means, identical to said first process generating means, coupled for sequentially receiving second data and latched second calculations and for providing first calculations;
   a first register coupled to a first clock and to the second process generating means for latching the first calculations upon receipt of a signal from the first clock and for providing the latched first calculations to the first process generating means; and
   a second register coupled to a second clock and to the first process generating means for latching the second calculations upon receipt of a signal from the second clock and for providing the latched second calculations to the second process generating means.

7. The process generating circuit according to claim 6 further comprising a multiplexer coupled between the second process generating means and the first register, the multiplexer having inputs for receiving the first calculations from the second process generating means, initialization data from a reset source, and a control signal from a control source, said multiplexer further having an output coupled to provide the first register with the initialization data or the first alternate calculations thereto according to the control signal.

8. The process generating circuit according to claim 7 wherein the first and second registers are LSSD registers.

9. The process generating circuit according to claim 8 wherein the signals from the first and second clocks are non-overlapping signals.

10. The process generating circuit according to claim 9 wherein the first process generating means is a first CRC generating circuit for providing the second calculations, the second calculations being CRC sums of the first data and the latched first calculations, and the second process generating means is an identical second CRC circuit for providing the first calculations, the first calculations being CRC sums of the second data and the latched second calculations.

11. A cyclic redundancy code generator, comprising:
    a first CRC circuit for generating first CRC sums, having:
    a first input for receiving first data; and
    a second input;
    a first register for latching said first CRC sums upon receipt of a signal from a first clock;
    a second CRC circuit, identical to said first CRC circuit, for generating second CRC sums, having:
    a first input for receiving second data; and
    a second input coupled to an output of said first register; and
    a second register for latching said second CRC sums upon receipt of a signal from a second clock, wherein an output of said second register is coupled to said second input of said first CRC circuit and wherein said signals from said first and second clocks are non-overlapping.

12. The cyclic redundancy code generator according to claim 11 further comprising a multiplexer coupled between the first CRC circuit and the first second register, the multiplexer having inputs for receiving the first CRC sums from the first CRC circuit, initialization data from a reset source, and a control signal from a control source, said multiplexer further having an output coupled to provide the first register with the initialization data or the first alternate CRC sums thereto according to the control signal.

13. The cyclic redundancy code generator according to claim 12 wherein the first CRC generating circuit is a first parallel CRC generating circuit, and the second CRC generating circuit is a second parallel generating circuit.

14. A controller system for transferring data between at least one channel and at least one device subsystem wherein the controller provides data integrity checks of the data at the speed of said at least one channel, comprising:
    a storage cluster;
    a multi path storage director in said storage cluster;
    a plurality of storage paths coupled to said storage director, each storage path of said plurality of storage paths being capable of providing simultaneous transfer of the data to said at least one device subsystem;
    nonvolatile storage in said storage cluster interconnected with said plurality of storage paths for holding the data prior to being transferred between the at least one channel and the at least one device subsystem, wherein the transferred data is checked for integrity by a CRC code;
    a first CRC generating circuit coupled for sequentially receiving first data of the data from the nonvolatile storage and latched first CRC sums and for providing second CRC sums therefrom;
    a second CRC generating circuit, identical to said first CRC generating circuit, coupled for sequentially receiving second data of the data from the nonvolatile storage and latched second CRC sums and for providing first CRC sums therefrom;
    a first register coupled to a first clock and to the second CRC generating circuit for latching the first CRC sums upon receipt of a signal from the first clock and for providing the latched first CRC sums to the first CRC generating circuit; and
    a second register coupled to a second clock and to the first CRC generating circuit for latching the second CRC sums upon receipt of a signal from the second clock and for providing the latched second CRC sums to the second CRC generating circuit.

15. The controller system according to claim 14 wherein the signals from the first and second clocks are non-overlapping signals.

16. The controller system according to claim 15 wherein the first and second registers are LSSD registers.

17. The controller system according to claim 14 wherein the nonvolatile storage has a battery backup.

* * * * *